United States Patent [19]

Smith

[11] 3,723,635

[45] Mar. 27, 1973

[54] DOUBLE-SIDED FLEXIBLE CIRCUIT ASSEMBLY AND METHOD OF MANUFACTURE THEREFOR

[75] Inventor: George T. Smith, Reynoldsburg, Ohio

[73] Assignee: Western Electric Company, Incorporated, New York, N.Y.

[22] Filed: Aug. 16, 1971

[21] Appl. No.: 172,000

[52] U.S. Cl...............174/68.5, 29/625, 317/101 DH, 339/176 MP

[51] Int. Cl...............H05k 1/00

[58] Field of Search ...174/68.5; 317/101 A, 101 CC, 317/101 CM, 101 CW, 101 F, 101 DH; 339/176 MF, 176 MP, 17 F, 17 LM, 17 M; 29/625, 262

[56] References Cited

UNITED STATES PATENTS 2,693,584 11/1954 Pifer..............317/101 F X
3,248,779 3/1966 Yuska et al..............317/101 AX
3,505,570 4/1970 Sprude..............317/101 CW

*Primary Examiner*—Bernard A. Gilheany
*Attorney*—W. M. Kain et al.

[57] ABSTRACT

Double-sided flexible printed circuits are formed with two sets of precious metal-plated terminals, each set being associated with a different circuit side of the flexible substrate and both sets initially being formed on the same side thereof. The two sets of terminals are initially positioned in two laterally disposed arrays along one edge region of the substrate, with each set being separated by a distance sufficient to allow the resulting substrate region therebetween without terminals to be bent around and secured to a rigid terminal support member. As thus fabricated, the two sets of terminals are positioned to overlie each other on opposite sides of the support member so as to allow access thereto by conventional female connectors, such as the double-row card type.

12 Claims, 6 Drawing Figures

INVENTOR
G. T. SMITH

BY. [signature]
ATTORNEY

FIG. 4
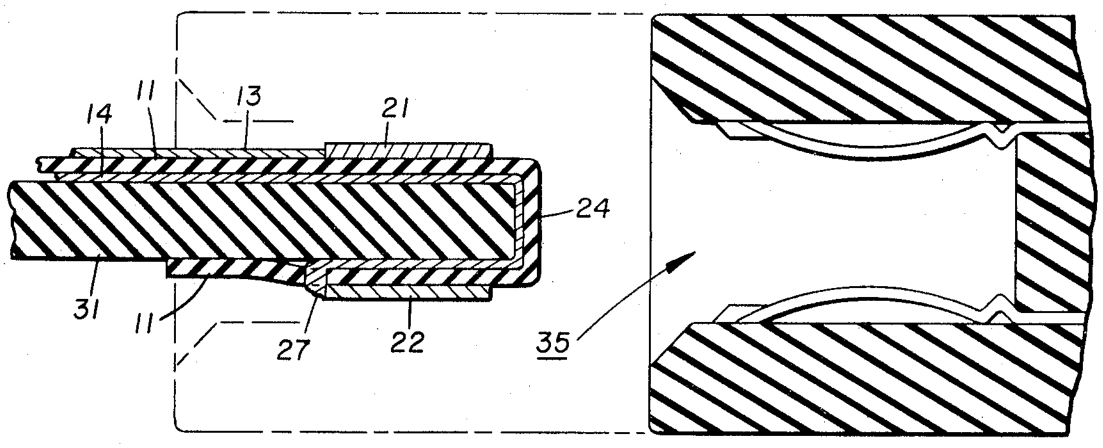
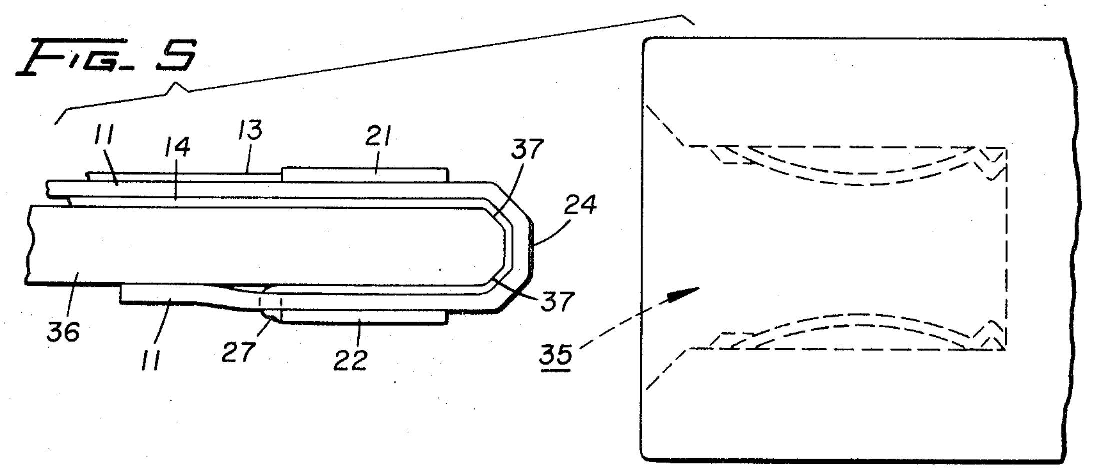
FIG. 6
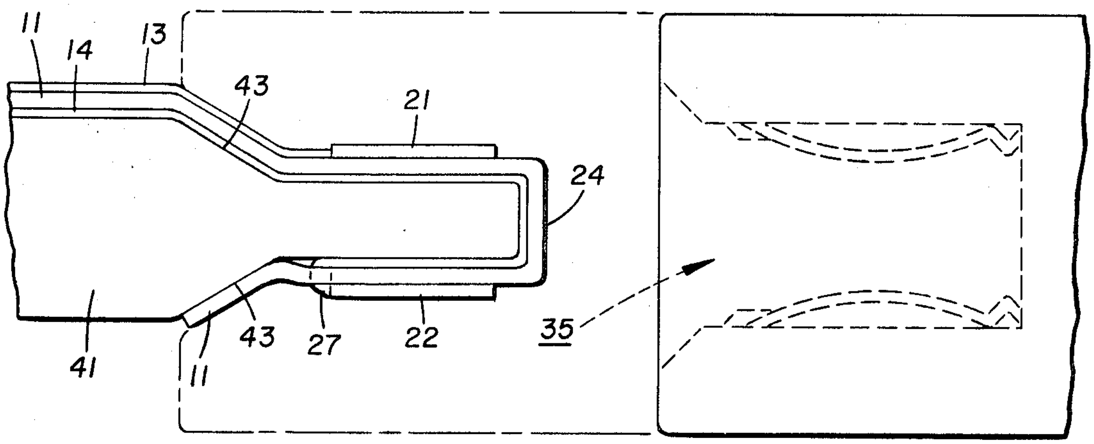

DOUBLE-SIDED FLEXIBLE CIRCUIT ASSEMBLY AND METHOD OF MANUFACTURE THEREFOR

BACKGROUND OF THE INVENTION

1. Field of the Invention

This invention relates to electrical circuits and, more particularly, to double-sided printed circuit assemblies with electrical terminals of the type having flexible, non-conductive substrates.

2. Description of the Prior Art

Printed circuits, in general, have afforded many advantages over conventional hand-wired circuits for many years, particularly in terms of their applicability to automated assembly. When employed in conjunction with passive components and active devices, either in discrete, hybrid, thin film or integrated circuit form, printed circuits have enabled not only simple, but complex electrical equipment and systems to be mass produced at reduced costs.

Moreover, the degree of automated assembly made possible by printed circuit techniques, in conjunction with component insertion apparatus, has resulted in the attainment of more consistently reliable product, due mainly to the elimination of hand wiring errors and the utilization of mass soldering techniques. Advancements and refinements in printed circuit technology have also contributed greatly to the microminiaturization of electrical circuits, apparatus and equipment.

It should be appreciated that while reference is made herein to only "printed circuits", that this general description is intended to encompass not only printed wiring and printed circuits, but to such wiring and circuits in the broadest sense, i.e., circuits and wiring formed not only by printing processes, but also by any one of a number of well known and generally employed methods of fabrication, involving such techniques as the etched foil, printed wire and transfer processes to mention only a few.

Printed circuit boards heretofore have generally comprised rigid substrates, primarily because of inherently being capable of supporting associated components and devices mounted thereon, and because of the ease with which external connections can be made to printed circuit terminals or tabs formed along one or more edges thereof. Notwithstanding these advantages, printed circuits formed on flexible substrates, hereinafter referred to simply as flexible printed circuits, are gaining wider acceptance and being used in an ever increasing number of applications. Such increased usage stems from a number of advantages that flexible circuits exhibit over rigid circuit boards, such as with respect to lower material costs, more easily formed and reliable plated through holes, reduced space requirements and choice of final substrate configuration. Flexible printed circuits are also conducive to continuous in-line processing, which can often considerably reduce fabrication costs.

As for flexible printed circuits not being able to provide the degree of support for electrical components and devices in the same manner as printed circuits with rigid substrates, problems in this area have been substantially reduced, if not eliminated, by the advent of microminiaturization, and/or by various techniques for bonding opposite ends of an elongated flexible printed circuit to spaced support structure in such a way that the flexible substrate is permanently maintained in a taut condition. Supported in this manner, flexible substrates can readily support the necessary components and/or devices to be mounted thereon.

One disadvantage of flexible versus rigid printed circuit substrates that has not been satisfactorily resolved to date, however, has been in providing reliable double-sided electrical terminals which can be readily accessed from either side by external female connectors, such as of the conventional card type.

In the case of single-sided flexible printed circuits, of course, the fabrication and adaptation of terminals thereon for use with external connectors can be accomplished almost as readily as for rigid printed circuit boards, by simply bonding at least that area of the flexible substrate underlying the terminals formed on the top side to a rigid support member. In this manner, the rigidly supported terminals can be readily inserted into a female card type connector.

With respect to double-sided terminal arrays formed on flexible substrates, however, a number of problems have been encountered and not satisfactorily resolved heretofore, particularly with respect to cost and interconnection reliability when compared with double-sided terminals formed on rigid printed circuit boards. More specifically, since the bonding of one side of a flexible substrate to a rigid support member eliminates access to that side as far as terminals are concerned, a number of other approaches have been attempted heretofore to provide access to double-sided circuitry without appreciable success.

One solution to the problem in question has been to access the top and bottom side flexible circuits by terminal arrays formed along different edges and on opposite sides of the flexible substrate. This, however, necessitates separate external connectors for each set of terminals which greatly increases costs, and presents many undesirable problems in circuit and equipment packaging, as well as in subsequent accessing for test and/or maintenance purposes.

Another technique of providing access to double-sided flexible circuitry heretofore has been to form the terminals for both the top and bottom circuits in a single array along one edge and on only one side of the flexible substrate, either in an alternate sequence or in predetermined groupings. Contact between the bottom side circuit and associated top side terminals can then be accomplished, for example, through the use of through-hole connections.

However, with an ever increasing emphasis being placed on microminiaturization today, coupled with the expanding use of not only hybrid, but thin film and integrated circuit components and devices, there often times is not sufficient substrate surface area along a given edge of a doublesided flexible printed circuit to accommodate an in-line array of terminals comprised of two independent sets. It, of course, should be appreciated that not only the minimum width of the terminals, but the minimum space between terminals, are dictated by a number of design factors, electrical as well as mechanical, and they pertain to both the circuit and the external connector.

Moreover, even in those cases where there may be sufficient flexible substrate surface area to accommodate two independent sets of terminals of the type in question, it is often desirable that access to the terminals nevertheless be made from opposite sides of the substrate, either because of the greater reliability achieved through double contact connections, or because of the less expensive construction of external female-type connectors (on a per contact basis) when comprised of overlying arrays of contacts which optimize space.

As a partial solution to providing double-sided terminals, selective terminals initially formed on one side of a flexible substrate, but interconnected by plated through-holes or in some other manner to the opposite side circuit, could be bent around an edge of a rigid terminal support member. This approach, however, has not met with success. For one thing, it obviously does not optimize the number of terminals that can be employed for a given surface area of the substrate. A more serious problem, however, is that for most circuit applications the terminals must be gold plated, and it has been found that any abrupt bending of such terminals after fabrication has had a tendency to crack the gold plating, thus rendering such terminals defective.

SUMMARY OF THE INVENTION

It, therefore, is an object of the present invention to provide a double-sided flexible printed circuit assembly and a method of manufacture therefor wherein double-sided terminals are formed in a manner that is competitive in cost, reliability, and external accessing with double-sided rigid printed circuit boards.

It is another object of the present invention to provide double-sided flexible printed circuit assemblies and a method of manufacture therefor wherein fabricated terminals may be readily accessed from opposite sides of a rigid, narrow support member extending along only one common terminal-defining edge region of a flexible substrate.

It is a further object of the present invention to provide a double-sided flexible printed circuit assembly and a method of manufacture therefor wherein two laterally disposed sets of precious metal-plated terminals may be formed and positioned on a flexible printed circuit substrate in such a manner that upon a portion of the substrate being folded back upon and secured to a rigid support member, the two sets of terminals are positioned in overlying, mutually disposed relationship on opposite sides of the support member, each set associated with a different circuit side of the substrate, and with none of the terminals being required to be bent around the support member.

In accordance with the principles of the present invention, the two sets of terminals respectively associated with the printed circuitry on opposite sides of the double-sided flexible substrate are initially both formed on the same side of the substrate. The first set of terminals is inset a sufficient distance from one common edge of the flexible substrate so as to allow the second set of terminals to be interposed therebetween. The second set of terminals is separated from the first set by a predetermined distance so as to define a longitudinally extending space therebetween. The terminals of the second set are also positioned to be in respective registry with lead-out circuit paths of the opposite side circuitry associated therewith, with through-hole connections preferably being used therebetween.

The resultant longitudinally extending space between the first and second sets of terminals is advantageously utilized as a fold-back area which allows the flexible substrate to be bent around an edge of and secured to opposite sides of a more rigid terminal support member. As such, the two sets of terminals are positioned in overlying spaced relationship, thus being readily accessed by conventional female connectors, such as of the card type. The fold-back area of the flexible substrate also advantageously contains no precious metal-plated terminals which could otherwise possibly be rendered defective by the tendency of the plated areas to crack when bent.

In addition to being applicable for use with conventional female type connectors, the subject double-sided flexible circuit assembly also affords the many other advantages over rigid printed circuit boards pointed out hereinabove.

BRIEF DESCRIPTION OF THE DRAWINGS

FIG. 4 is an enlarged, partial side elevational view of the double-sided flexible circuit of FIGS. 1–3 fabricated as an assembly, with the two sets of terminals formed thereon permanently positioned in overlying, spaced relationship on opposite sides of the associated support member so as to be readily accessed by a typical female type of mating connector, and FIGS. 5 and 6 are enlarged, partial side elevational views of slightly modified alternative flexible circuit configurations wherein the terminal end of the support member is specially contoured in order to further facilitate terminal insertion within a mating connector.

DETAILED DESCRIPTION

Figure 1:
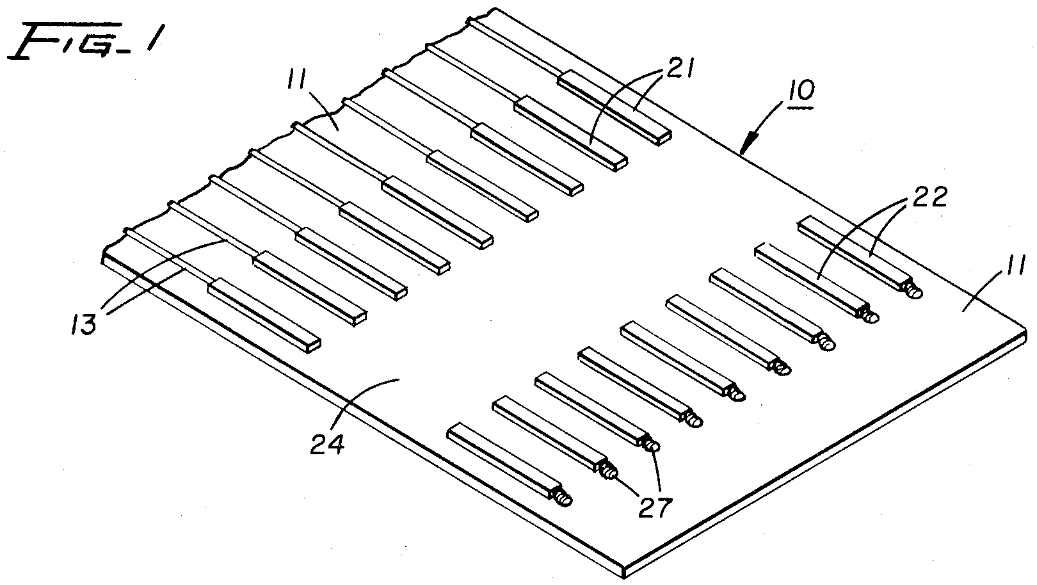
FIG. 1 is a perspective view of the top side of a double-sided flexible printed circuit and illustrates the manner in which two sets of circuit terminals are formed and positioned on the flexible substrate in accordance with the principles of the present invention.
Figure 2:
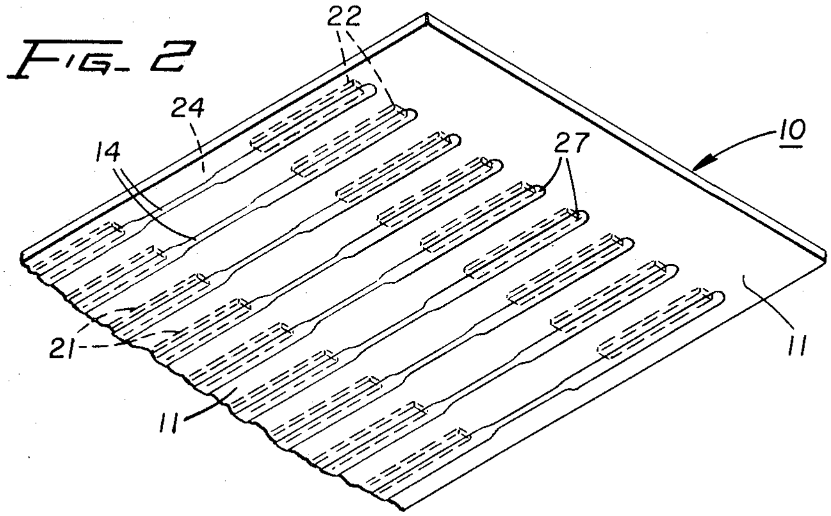
FIG. 2 is a perspective view of the bottom side of the double-sided flexible circuit depicted in FIG. 1.

In accordance with the principles of the present invention, and with specific reference to one preferred embodiment thereof, as depicted in FIGS. 1–4, a double-sided flexible printed circuit designated generally by the reference numeral 10 comprises a thin, non-conductive flexible substrate 11 having a plurality of discrete circuit paths 13 formed on the top side thereof (FIG. 1), and a plurality of discrete circuit paths 14 formed on the bottom side thereof. While only a portion of the double-sided circuit is illustrated, it should be readily understood that the circuit paths may be formed in any one of a number of patterns to satisfy a specific circuit application, and may include a number of throughhole connections (not shown) interconnecting the top and bottom circuits.

Similarly, such flexible printed circuits, as in the case with rigid printed circuit boards, may have discrete or hybrid devices and components mounted thereon, and may also have thin film and integrated circuit devices and components actually processed thereon.

As the present invention is primarily concerned with a unique technique of forming double-sided terminals on flexible circuits, primary attention will be directed hereinafter only to the termination aspects of flexible printed circuits.

The thin film substrate 11 may comprise any one of a number of thermoplastic films, such as of Mylar, Teflon, Kapton or polyurethane, to mention a few. As for the printed circuitry and terminals, at least the base layer of major thickness (generally of the order of 0.001 to 0.005 inch) are preferably formed of copper.

In describing the manner in which the double-sided terminals are formed and positioned on the flexible printed circuit in accordance with one illustrative embodiment of the present invention, reference will be made, by way of example only, to the widely used etched foil process for fabricating printed circuits and associated terminals. In accordance with this process for double-sided circuits, a copper foil is bonded to each side of the plastic film 11 initially, with an acid resist pattern employed to define the desired conductive circuit paths and terminals, as well as land areas associated with any through-hole connections. A wet screen printer is preferably used to form the resist pattern. The unwanted copper foil is then etched away either before or after a solder plating operation, leaving the desired circuit and terminal patterns.

It is to be understood, of course, that if thin film resistors or capacitors or other types of active or passive elements were also to be formed on the flexible substrate as a part of the printed circuitry, a combination of well-known fabrication techniques may be required in order to fabricate the total circuitry necessary for a given application.

With attention now being directed particularly to the fabrication of the electrical terminals employed with a double-sided flexible circuit of the type embodied herein, considerable difficulty has been encountered heretofore, as previously mentioned, in adapting such terminals for use with conventional female connectors, such as of the card type. One problem has been that a rigid terminal support member is required to allow the otherwise flexible terminal edge of the substrate to be inserted within an associated connector. However, if a rigid support member is bonded or otherwise secured to one side of the flexible substrate, as has normally been the practice, then only one printed circuit side of the substrate can have terminals formed thereon in a manner which allows terminal accessing by respectively associated contacts of an external connector.

Prior attempts to bend selected top side terminals associated with the bottom side circuit around a rigid support member so as to provide selective opposite side circuit contact, has been found to result in detrimental cracking of the outer layer of precious metal normally plated on the copper base terminals. Accordingly, abrupt bending or folding back of such plated terminals normally cannot be tolerated.

The present invention obviates the problems encountered heretofore in providing easily fabricated, reliable and readily accessed double-sided terminals for flexible circuits by initially forming two sets of terminals 21,22 on the same side of the substrate 11, as best seen in FIG. 1. These terminals, of course, are preferably formed at the same time and in the same manner as the printed circuits, using any one of the aforementioned printed circuit fabrication techniques. The first set of terminals 21, associated with the top side printed circuit paths 13, is inset a sufficient distance from one common terminal edge of the flexible substrate so as to allow the second set of terminals 22 to be interposed between the first set and the common edge of the substrate so as to provide a longitudinally extending space 24 therebetween. The second set is also formed in parallel, and preferably in end-to-end, relationship with the first set of terminals.

The terminals 22 of the second set are formed to be in respective registry with what actually comprise lead-out extensions of the circuit paths 14 of the opposite side circuitry associated therewith (best seen in FIG. 2), with conventional plated through holes 27 preferably being relied upon for effecting interconnections therebetween. It is to be understood, of course, that the through-hole connections may be accomplished not only by plating operations but by the insertion of various types of conductive eyelets therethrough.

It is normally desirable, as depicted, to have the lead-out portions of the circuit paths 14 conform in cross-section not only to the respective overlying associated terminals 22, but to the non-associated terminals 21. In this manner, undesirable depressions in the substrate will be minimized as a result of any pressure exerted on the fabricated flexible circuit during the bonding thereof to the support member, and/or from the spring-biased forces exerted on the terminals by the mating contacts of an external connector. It should also be appreciated that while through-hole connections 27 are shown at the outermost extremities of the terminals 22 associated with the underside circuitry, such through-hole connections could just as readily be formed at the innermost ends of the terminals 22. Similarly, while the terminals 22 are disclosed in the illustrative embodiment as being inset a short distance from the common terminal edge of the flexible substrate 11, they may just as readily be formed to terminate at the edge of the substrate, particularly if the associated through-hole connections are formed at the innermost ends of the terminals 22.

As previously indicated, the two sets of terminals 21 and 22 are normally plated with a layer of precious metal, preferably gold, so as to prevent oxidation of the surface areas thereof and thereby insure that reliable electrical contact is made with the contacts of external connectors. It should be appreciated that a precious metal overlay may be formed on the terminals not only by an electroplating operation, but by an electroless or vapor deposition operation.

Figure 3:
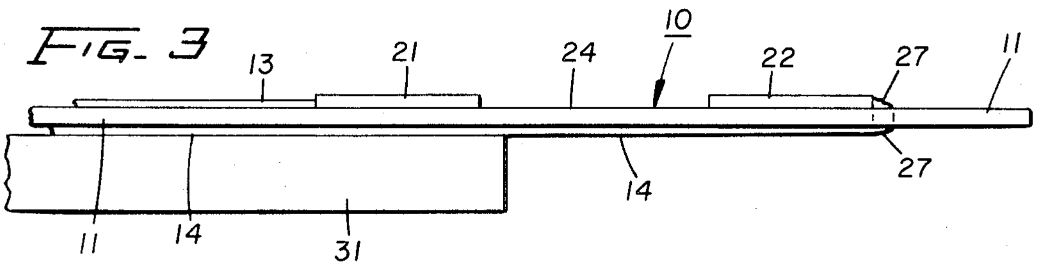
FIG. 3 is an enlarged, partial side elevational view of the double-sided flexible circuit after a portion of the bottom side thereof has been secured to a rigid terminal support member, but before the set of terminals nearest the edge of the substrate has been bent back under the support member in a U-shaped manner and the substrate secured thereto.

The resultant longitudinally extending space 24 defined between the first and second sets of terminals 21, 22 is advantageously utilized as a fold-back area so as to allow the two sets of terminals to be positioned on opposite sides of a more rigid support member 31, best seen in FIGS. 3 and 4. Fabricated in this manner, none of the gold plated terminals are required to be bent around the forward edge of the terminal support member 31.

The portions of the substrate (and normally also the printed circuitry) in contact with the support member are secured thereto, preferably by a bonding operation, utilizing any one of a number of conventional adhesives or cements. In those cases when the terminal support member 31 comprises a thermoplastic material, a thermocompression bond may be employed to secure the substrate 11 thereto.

As a result of not having to form the terminals respectively associated with the top and bottom side circuits for ultimate use on the same side of the substrate, it also becomes readily apparent that so-called double-row connectors 35 of the card type, for example, as depicted in FIGS. 4–6, may be advantageously employed. This, of course, effectively doubles the number of circuit terminations that can be employed along a given edge of a flexible substrate, and makes such circuits for the first time very competitive with double-sided rigid circuit boards.

In addition to being applicable for use with card-type connectors, double-sided flexible printed circuit assemblies of the type embodied herein also afford a number of other advantages over rigid printed circuit boards. Specifically, flexible substrate materials cost considerably less than most rigid substrate materials. With the possible exception of glass-filled epoxy substrates, most conventional flexible substrate materials of the aforementioned types also exhibit superior dimensional stability, which is of particular importance in the fabrication of microminiaturized circuitry.

Concomitantly, thin, flexible substrates are more conducive to the forming of plated through holes therethrough, to maximizing the utilization of space and to allowing for a wider choice of final configuration. Flexible circuits also readily lend themselves to continuous in-line processing which can greatly reduce manufacturing costs.

FIGS. 5 and 6 disclose several alternative configurations of the double-sided flexible printed circuit assembly depicted in FIG. 4. More specifically, the forward end of the associated terminal support member 36 in FIG. 5 is formed with beveled corners 37 so as to facilitate the insertion of the mutually disposed sets of terminals 21, 22 into an associated mating card-type connector 35.

FIG. 6 discloses still another variation of the flexible circuit of FIG. 4 wherein the support member 41 is formed with two mutually disposed tapered sections 43. These sections can be utilized to facilitate the forming of the outwardly extending terminal nose portion of the support member with any desired thickness so as to be compatible with a given external connector 35. Such tapered surfaces also function as positive stops for mating tapered surfaces formed on the nose portion of the associated connector. These stops in certain applications can be of particular advantage in preventing that portion of the substrate folded around the nose portion of the support member from making physical, and perhaps undesirable frictional contact with an inner surface of the connector. Such contact, if repeated many times as a result, for example, of routine maintenance or testing, could possibly prove detrimental to the underlying lead-out circuitry.

As disclosed, the non-conductive tapered surfaces of the connector would make planar surface contact with short segments of the lead-out circuit paths. Such contact could be readily obviated, however, by forming a pair of spaced, integral ribs on each tapered surface of either the terminal support member or the connector. Such ribs would be oriented to protrude outwardly from and extend in the direction of the tapered surfaces so as to provide the necessary clearance to prevent printed circuit-connector contact. Additional ribs, of course, could also be readily formed along the tapered regions, as long as they were positioned to extend outwardly between adjacent lead-out circuit paths and the associated contacts of the connector.

In summary, a double-sided flexible printed circuit assembly has been disclosed wherein two independent sets of electrical terminals, each associated with a different circuit side, are initially formed on only one side of the flexible substrate in accordance with any one of a number of conventional printed circuit techniques. Thereafter, the two sets of terminals are positioned on opposite sides of a terminal support member in such a manner as to be readily accessed by contacts of conventional female connectors, such as of the card type, without requiring any bending of the terminals around an edge of the support member.

What is claimed is:

1. A method of fabricating a double-sided electrical circuit assembly comprising:

forming a first conductive circuit pattern of desired configuration on a first side of a flexible nonconductive substrate;

forming a second conductive circuit pattern of desired configuration on the opposite second side of said substrate;

forming a first set of terminals on the first side of said substrate electrically connected to said first circuit pattern, said first set of terminals being inset a predetermined distance relative to at least one edge of said substrate;

forming a second set of terminals on the first side of said substrate in parallel relationship with said first set of terminals so as to define a longitudinally extending predetermined space between said first and second sets of terminals;

interconnecting said second set of terminals through said substrate to said second circuit pattern on the opposite side of said substrate;

bending that portion of said substrate encompassing said longitudinally extending space around an edge of a terminal support member dimensioned so as to position the first and second sets of terminals on top and bottom surfaces of said support member, respectively; whereby said first and second sets of terminals are positioned in overlying, mutually disposed relationship readily accessed by contacts of an external female-type connector, and securing at least that portion of said substrate bent around said support member to said support member.

2. A method of fabricating a double-sided circuit assembly in accordance with claim 1, wherein in forming said first set of terminals, each terminal thereof is positioned in mutually aligned relationship with a different terminal of the second set, and wherein in permanently securing said substrate to said support member, at least that portion of the second side of said substrate in contact with said support member is bonded thereto.

3. A method of fabricating a double-sided circuit assembly in accordance with claim 1, wherein in interconnecting said second set of terminals to said second circuit pattern on the opposite side of said substrate, plated-through holes are formed.

4. A method of fabricating a double-sided circuit assembly in accordance with claim 3, further including the step of plating at least the terminals of said first and second sets with a layer of precious metal.

5. A method of fabricating a double-sided circuit assembly in accordance with claim 4, further including the step of forming beveled corners on the terminal support member along the edge thereof about which a portion of the flexible substrate is bent so as to facilitate the insertion of the terminal end of the double-sided circuit in a female-type connector.

6. A method of fabricating a double-sided circuit assembly in accordance with claim 4, further including the step of forming tapered regions on opposite sides of the terminal support member, said tapered regions being mutually disposed and oriented in a direction so as to provide a predetermined thickness dimension at the terminal supporting end of the support member which is compatible with a given external female-type connector, said tapered regions also functioning as positive stops when contacted by outwardly extending nose portions of an external connector.

7. A double-sided electrical circuit assembly comprising:

- a thin, flexible non-conductive substrate;
- a first conductive circuit pattern of predetermined configuration formed on a first side of said substrate;
- a second conductive circuit pattern of predetermined configuration formed on the second side of said substrate;
- a relatively rigid support member having a top surface area, an edge surface area and a bottom surface area secured to at least a portion of the second side of said substrate upon the latter being bent around said support member in a U-shaped manner;
- a first set of terminals formed on said first side of said substrate and electrically connected to said first circuit pattern, said first set of terminals being inset a predetermined distance from one edge of said substrate;
- a second set of terminals formed on the first side of said substrate and connected to said second circuit pattern on the opposite side of said substrate by means of through-hole connections, said second set of terminals being interposed between said first set of terminals and the adjacent common edge of said substrate so as to define a longitudinally extending fold-back space of predetermined width between said first and second sets of terminals, said substrate being folded back, along said longitudinally extending space, around the edge surface area of said support member and secured to the top and bottom surfaces thereof so as to position permanently said first and second sets of terminals in mutually disposed, overlying relationship on opposite sides of said support member.

8. A double-sided circuit assembly in accordance with claim 7, wherein each terminal of said first set is positioned in mutually aligned relationship with a different terminal of the second set, and wherein at least that portion of the second side of said substrate in contact with said support member is bonded thereto.

9. A double-sided circuit assembly in accordance with claim 7, wherein said second set of terminals is electrically connected to said second circuit pattern on the opposite side of said substrate by plated through-holes.

10. A double-sided electrical circuit assembly in accordance with claim 9, wherein the terminals of said first and second sets are formed as rectangularly shaped tabs so as to be readily accessed by mating contacts of female type connectors, and wherein said terminals are formed with a base layer of copper and have a thin overlying layer of precious metal deposited thereon.

11. A double-sided circuit assembly in accordance with claim 9, wherein the edge surface area of said terminal support member is formed with beveled corners so as to facilitate the insertion of said first and second sets of terminals within a female-type connector.

12. A double-sided circuit assembly in accordance with claim 9, wherein said terminal support member is formed with at least two mutually disposed tapered regions, said regions being formed inwardly of said terminals and oriented toward each other in the direction of said terminals so as to provide said support member with both a terminal supporting thickness dimension compatible for use with a given female-type connector, and positive stops for outwardly extending nose portions of a connector when brought into contact therewith.

* * * * *